Sept. 21, 1965 H. E. RUEHLEMANN 3,208,026

PROTECTOR OF PRINTED CIRCUIT CONTACTS

Filed Oct. 31, 1961 2 Sheets-Sheet 1

INVENTOR.
HERBERT E. RUEHLEMANN

BY

Caesar and Rivise

ATTORNEYS.

PROTECTOR OF PRINTED CIRCUIT CONTACTS

Filed Oct. 31, 1961 2 Sheets-Sheet 2

INVENTOR.
HERBERT E. RUEHLEMANN
BY
Caesar and Rivise
ATTORNEYS.

United States Patent Office 3,208,026
Patented Sept. 21, 1965

3,208,026
PROTECTOR OF PRINTED CIRCUIT CONTACTS

Herbert E. Ruehlemann, Huntingdon Valley, Pa., assignor to Elco Corporation, Philadelphia, Pa., a corporation of Pennsylvania Filed Oct. 31, 1961, Ser. No. 149,094
1 Claim. (Cl. 339—17)

This invention relates to a protector of printed circuit contacts for use in connection with a printed circuit board or other surface to which contacts are secured.

It is known to stake contacts to printed circuit boards in a manner as exemplified by Fox Patent No. 2,994,056 which issued on July 25, 1961. The particular contacts secured to a board may be of many types well known to the art. Such contacts are exemplified by the contacts disclosed in Fox Patent No. Re. 23,547, Fox Patent No. 2,750,572, Fox Patent No. 2,828,464 and Fox Patent No. D. 173,694.

The contacts are staked to the board by well known techniques such as by using a staking tool which shaves away certain portions of the contact tail and forces the shaved portions upwardly against the lower surface of the board to prevent further contact movement. A soldering step usually completes the connection.

The contacts prior to securement to a board may be initially removably adhered to a plastic strip with the contact tails extending away from the strip as described in copending application Serial No. 686,974 filed September 30, 1957, and now abandoned. In this form, the contacts are spaced from each other at precise distances which correspond to precisely spaced openings in the printed circuit board. The user breaks the plastic strip at a desired place to obtain a strip having the desired number of contacts. The contacts are then simultaneously applied to the printed circuit board so that the contact tails are positioned in the openings in the printed circuit board and then they are staked thereto as previously described. Heretofore, the user has generally thereafter broken the plastic strip in order to remove it from the contacts thereby leaving the contacts freely staked to the printed circuit board.

However, it has been discovered that, because the contacts are standing free, they sometimes will be damaged. In addition, in quality equipment, the contacts must be protected from disruptive forces, such as vibration.

Previously, it was attempted to protect the contacts by not separating the plastic strip upon which the contacts are positioned, and thereby permitting the plastic strip to function as a protective guard. This technique has several practical limitations, one of which is that the plastic strip must be otherwise secured to the board to relieve the stress which would be imposed upon the staked contacts. In order to do this, it is necessary to provide guide pins with complementary holes or other securing means. Such a technique is expensive and, moreover, the plastic strip may not afford the desired protection for the contacts.

It is accordingly an object of this invention to provide a protector for printed circuit contacts which is simply manufactured and easily applied.

It is a further object of this invention to provide a protector for printed circuit contacts which provides the necessary protection from inadvertent damage and insures satisfactory performance in uses with quality equipment.

The foregoing as well as other objects of the invention are achieved by providing a protective insulating bar which is compression transferred or injection molded, and which comprises an elongated body member having slits which enable the bar to nest about the contacts, the body member also having means whereby it can be firmly secured to the printed circuit board. An additional feature of the invention is to be found in the provision of an air space between certain portions of the body member and the printed circuit board in order to avoid the trapping of moisture therebetween.

In a first embodiment of the invention, the contacts are initially staked to the printed circuit board and the protector is then positioned thereover. In a second embodiment of the invention, the contacts are initially secured to the protective member by adhesive or gluing techniques. The protector is then secured to the printed circuit board and the contacts are thereafter staked to the printed circuit board. In this embodiment, the protector should be of a thermosetting material in view of the heat developed during the course of dip-soldering techniques which normally follow the staking of the contact tails to the printed circuit board.

In a third embodiment of the invention, the contacts are integrally molded into the protector rather than being merely secured thereto as in the second embodiment.

Other objects and many of the attendant advantages of this invention will be readily appreciated as the same becomes better understood by reference to the following detailed description when considered in connection with the accompanying drawings wherein.

Referring now in greater detail to the various figures of the drawings wherein similar reference characters refer to similar parts, there is shown at 10 in FIGS. 1 to 4 a protector of printed circuit contacts constituting a first embodiment of the present invention.

Figures 1, 6, 7:
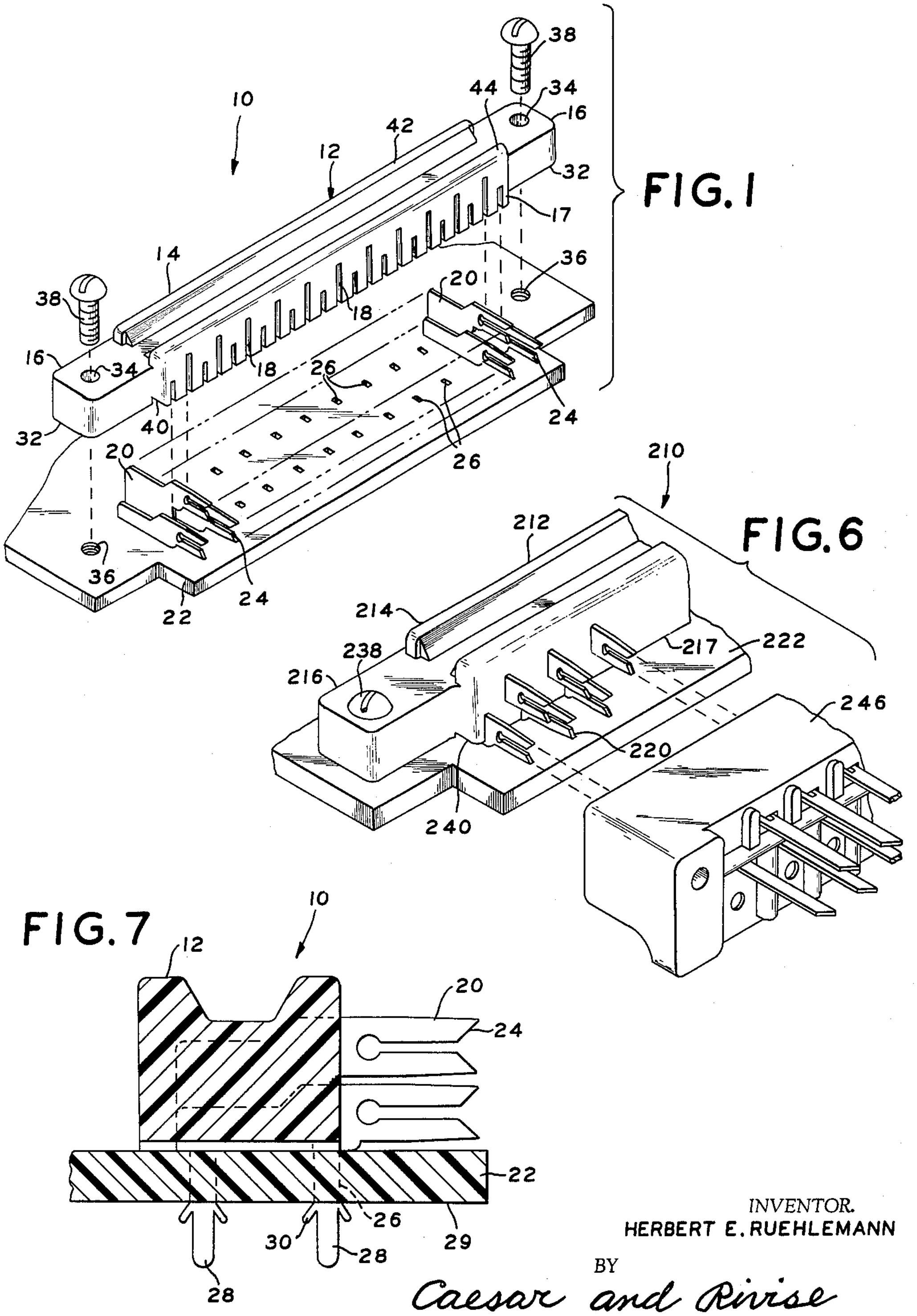
FIG. 1 is an exploded perspective view showing a protector constituting a first embodiment of the present invention about to be applied to a printed circuit board to which contacts have already been staked.
FIG. 6 is an exploded perspective view similar to FIG. 2 but showing a third embodiment of the present invention wherein the contacts are initially integrally molded to the protector.
FIG. 7 is an enlarged sectional view taken along the lines 7—7 of FIG. 2.

Device 10 basically comprises an elongated body member 12 which includes a protector section 14 and fastening flanges 16 extending from the protector section 14. The protector section 14 is of a generally rectangular cross-section and includes parallel spaced nesting slits 18 extending upwardly from lower surface 17 which are adapted to receive the contacts 20 which have been affixed to printed circuit board 22. Each slit 18 is of a sufficient height to receive the contacts 20.

As shown in FIGS. 1 and 7, the contacts 20 are staked to the printed circuit board 22. The contacts 20 have an engaging portion 24 which is basically of the type shown in Fox Patent No. 2,828,464 and Fox Patent No. D. 173,694. The contacts are first inserted in appropriate openings 26 in the printed circuit board such that the tails 28 thereof extend beyond the lower surface 29 of the board 22. A staking tool is then used to shave certain portions 30 of the contact tail 28 in order to firmly secure the contact to the printed circuit board. As indicated in FIG. 1, the contacts may be vertically staggered from each other in alternate tiers such that the engaging portion 24 of alternate contacts is spaced a greater distance from the printed circuit board. The remainder of the taller contacts including the holding portion thereof is appropriately constructed in order that the engaging portion thereof may be spaced such greater distance.

Contacts 20 may be furnished as removably secured in spaced relationship to a plastic strip as described in copending application Serial No. 686,974, filed September 30, 1957. In such an arrangement, the contact tails 28 extend away from the plastic strip. Thus the contact tails are free to be inserted into the complementary openings 26 in the printed circuit board 22. The staking and soldering then follow and the plastic strip is thereafter broken away from the contacts. The technique of supplying contacts as removably secured to the plastic strip greatly facilitates the handling thereof.

Figures 2, 3, 4, 5:
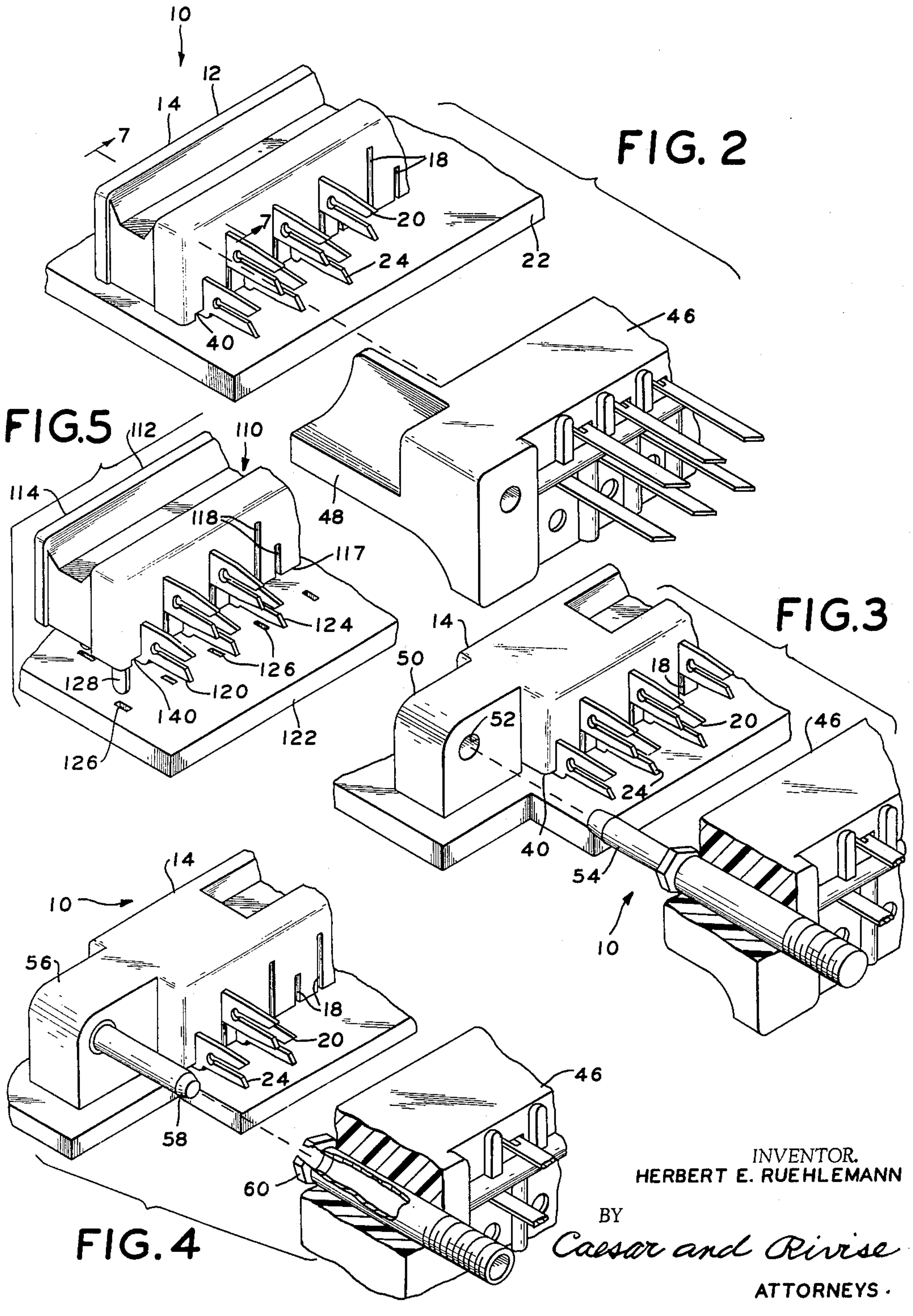
FIG. 2 is an exploded perspective view of a first variant of the protector of FIG. 1 in operative position upon contacts staked to a printed circuit board and also showing an opposed mating connector member.
FIG. 3 is an exploded view similar to FIG. 2 but shows a second variant of the protector of FIG. 1.
FIG. 4 is an exploded view similar to FIG. 2 but shows a third variant of the protector of FIG. 1.
FIG. 5 is an exploded perspective view similar to FIG. 1 showing a second embodiment of the present invention wherein the contacts are initially adhesively secured to the protector member.

After the contacts have been staked and duly soldered to the printed circuit board, the assembly is as shown in the lower portion of FIG. 1. The protector 10 is then positioned upon the printed circuit board 22 such that the lower surfaces 32 of flanges 16 rest upon the printed circuit board as indicated in FIGS. 2 to 4. Complementary openings 34 and 36 in the flanges 16 and the printed circuit board 22, respectively, are made to coincide in order that a bolt 38 may pass therethrough. Fastening nuts (not shown) may be employed where desired or openings 34 and 36 may be threaded to receive the bolt 38.

When the protector is positioned upon the printed circuit board, each contact 20 is received in a slit 18 in protector section 14 of the protector. As indicated in FIGS. 1 and 2, lower edge 40 of the body member 12 defining lower surface 17 does not abut against the printed circuit board 22. It is rather slightly spaced from the printed circuit board 22 by virtue of the lower surfaces 32 of flanges 16 resting upon the printed circuit board as was previously discussed and by the slight protrusion of the contacts from the bottom surface of the protector. This spacing provides an air space which prevents the entrapment of moisture beneath the protector member. Utility walls 42 and 44 are also formed in the body member 12.

FIG. 2 shows a first variant of the embodiment of FIG. 1 wherein flanges 16 are eliminated and the weight of the protector member 10 plus the mating connector member 46 is relied upon to maintain contact thereof with the printed circuit board 22. As shown in FIG. 2, the connector member 46 has contacts which will mate with the contacts 20 affixed to printed circuit board 22. The connector member 46 also possesses guiding flanges 48 which will nest about protector 10 of FIG. 2 when the connector 46 is mated with contacts 20.

FIG. 3 shows a second variant of the embodiment of FIG. 1 wherein fastening flanges 50 extend from protector section 14. A horizontal receptacle opening 52 is formed in the flanges 50. The opening 52 is adapted to lockingly receive a pin 54 which extends from mating connector member 46.

FIG. 4 shows a third variant of the embodiment of FIG. 1 wherein flanges 56 extend from the protector section 14. Pins 58 project from flanges 56 and are adapted to be received in sockets 60 which are secured to the mating connector member 46.

FIG. 5 shows a second embodiment 110 of the present invention. The protector 110 is similar in many respects to the protector 10 of FIG. 2. Thus the protector 110 basically comprises an elongated body member 112 which includes a protector section 114 having a generally rectangular cross-section. The protector section 114 includes parallel spaced nesting slits 118 which extend upwardly from lower surface 117.

In this embodiment of the invention, as shown in FIG. 5, the contacts 120 are adhesively fastened or glued in the slits 118 prior to the staking of the contacts 120 to the printed circuit board 122. Thus the protector member 110 with its associated contacts 120 are simultaneously applied to the printed circuit board 122. The pre-formed openings 126 in the printed circuit board permit the tails 128 of the contacts 120 to project beneath and beyond printed circuit board 122 in the manner as indicated in FIG. 7. Thereafter the contacts are staked and soldered as previously described. Inasmuch as the soldering is done after the protector 110 is abutting against the board 122, it is preferable that the protector 110 be constructed of a thermosetting material to avoid damage from the heat of soldering.

Lower edge 140 of the body member 112 defining lower surface 117 does not abut against printed circuit board 122 in order to provide an air space as previously discussed in connection with FIG. 1. Also, the contacts 120 mate with contacts of a mating connector member as previously described.

A third embodiment 210 of the present invention is shown in FIG. 6. Device 210 is similar in many respects to device 10 of FIG. 1 and basically comprises an elongated body member 212 which includes a protector section 214 and fastening flanges 216 extending from the protector section 214. The protector section 214 is of a generally rectangular cross-section but does not possess the parallel spaced nesting slits of the protectors of FIGS. 1 to 5. In this embodiment of the invention the contacts 220 are integrally molded into the protector section 214.

Thus, the protector member 210 with its associated contacts 220 are simultaneously applied to the printed circuit board 222. Preformed openings are provided in the printed circuit board 222 to permit the tails of contacts 220 to project beneath and beyond the printed circuit board in a manner as indicated in FIG. 7. Thereafter, the contacts are staked and soldered as previously described. Inasmuch as the soldering is done after the protector 210 is abutting against the board 222, it is preferable that the protector 210 be constructed of a thermosetting material to avoid damage from the heat of soldering.

It is to be noted that lower edge 240 of the body member 212 defining lower surface 117 does not abut against printed circuit board 222 in order to provide an air space as previously discussed in connection with FIG. 1. Moreover, bolts 238 are provided in flanges 216 for securement of protector 210 to printed circuit board 222. Also, the contacts 220 mate with contacts of mating connector member 246.

It is thus seen that the present invention provides a protector for printed circuit contacts which is simply manufactured and easily applied and which provides the necessary protection from inadvertent damage and insures satisfactory performance in uses with quality equipment.

Obviously many modifications and variations of the present invention are possible in the light of the above teachings. It is, therefore, to be understood that within the scope of the appended claim, the invention may be practiced otherwise than as specifically described.

What is claimed as the invention is:

A plug member for use in connection with a printed circuit board, said member having flat contacts to be secured in standing relationship to printed members of said printed circuit board, said plug member comprising an elongated insulating body member having at least two parallel spaced nesting slits, flat contacts adhesively secured in said slits and having legs depending from said body member, said legs being received in complementary openings in said printed circuit board, said body member including spaced end flanges and a lower slightly inset edge, said spaced end flanges being adapted to be secured to said printed circuit board, said lower edge of said body member being slightly spaced from said printed circuit board when said flanges are secured thereto to provide an air space to prevent the entrapment of moisture between said protector and said printed circuit board.

(References on following page)

References Cited by the Examiner

UNITED STATES PATENTS

| | | | |
|---|---|---|---|
| 1,984,036 | 12/34 | Schwartzmann | 339—198 X |
| 2,707,272 | 4/55 | Blitz | 339—17 |
| 2,760,176 | 8/56 | Del Camp | 339—17 X |
| 2,864,977 | 12/58 | Witt et al. | 339—17 |
| 2,891,229 | 6/59 | Flanagan | 339—17 |
| 2,944,131 | 7/60 | Kernander | 200—166 |

FOREIGN PATENTS

| | | |
|---|---|---|
| 69,606 | 7/59 | France. |
| 820,362 | 9/59 | Great Britain. |

OTHER REFERENCES

Elco, "Electrical Design News," March, 1958, page 24.

JOSEPH D. SEERS, *Primary Examiner.*

ALBERT H. KAMPE, *Examiner.*